United States Patent
Park et al.

(10) Patent No.: US 11,818,929 B2
(45) Date of Patent: Nov. 14, 2023

(54) DISPLAY DEVICE WITH REPAIR PATTERNS

(71) Applicant: LG Display Co., Ltd., Seoul (KR)

(72) Inventors: JunHwan Park, Paju-si (KR); JunSu Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 126 days.

(21) Appl. No.: 17/399,607

(22) Filed: Aug. 11, 2021

(65) Prior Publication Data

US 2022/0123092 A1 Apr. 21, 2022

(30) Foreign Application Priority Data

Oct. 21, 2020 (KR) .......................... 10-2020-0136949

(51) Int. Cl.
| | | |
|---|---|---|
| *H10K 59/131* | (2023.01) | |
| *G02F 1/13* | (2006.01) | |
| *G02F 1/1362* | (2006.01) | |
| *H10K 71/00* | (2023.01) | |

(52) U.S. Cl.
CPC ......... *H10K 59/131* (2023.02); *G02F 1/1309* (2013.01); *G02F 1/136259* (2013.01); *G02F 1/136263* (2021.01); *H10K 71/861* (2023.02)

(58) Field of Classification Search
None
See application file for complete search history.

(56) References Cited

U.S. PATENT DOCUMENTS

| | | | | |
|---|---|---|---|---|
| 5,298,891 | A | * 3/1994 | Plus | ....................... G02F 1/1362 345/93 |
| 9,129,923 | B1 | 9/2015 | Han et al. | |
| 11,177,336 | B2 | 11/2021 | Gai et al. | |
| 11,226,525 | B2 | 1/2022 | Li et al. | |
| 2004/0125300 | A1* | 7/2004 | Lee | ................... G02F 1/134363 349/141 |
| 2004/0169781 | A1* | 9/2004 | Lee | ................... G02F 1/136259 349/54 |

(Continued)

FOREIGN PATENT DOCUMENTS

| | | |
|---|---|---|
| EP | 2955709 A1 | 12/2015 |
| EP | 2980853 A2 | 2/2016 |

(Continued)

OTHER PUBLICATIONS

European Patent Office, Extended European Search Report and Opinion, EP Patent Application No. 21203726.1, dated Mar. 7, 2022, eight pages.

*Primary Examiner* — Ryan Crockett
(74) *Attorney, Agent, or Firm* — Fenwick & West LLP

(57) ABSTRACT

Embodiments of the present disclosure are related to a display device, as repairing a disconnection of a gate line by using a driving voltage line and a driving voltage line connection pattern disposed on a pixel where a point that the gate line is disconnected is located, the disconnection of the gate line can be repaired easily while minimizing an arrangement of additional components. Furthermore, as making a pixel where a repaired point is located to be darkened and to be connected to adjacent pixel to be driven, a disconnection defect of the gate line can be repaired while preventing an image abnormality due to the disconnection and the repair of the gate line.

17 Claims, 12 Drawing Sheets

(56) References Cited

U.S. PATENT DOCUMENTS

| | | | |
|---|---|---|---|
| 2006/0279499 A1* | 12/2006 | Park | G09G 3/3225 |
| | | | 345/92 |
| 2010/0265424 A1* | 10/2010 | Chiu | G02F 1/136259 |
| | | | 349/54 |
| 2012/0300165 A1* | 11/2012 | Zhuang | G09G 3/3648 |
| | | | 445/2 |
| 2015/0130787 A1* | 5/2015 | Chung | G09G 3/3225 |
| | | | 345/76 |
| 2015/0364531 A1* | 12/2015 | Kim | H10K 59/131 |
| | | | 438/4 |
| 2017/0269446 A1* | 9/2017 | Sang | G02F 1/13338 |
| 2020/0083312 A1 | 3/2020 | Kim et al. | |
| 2020/0183237 A1* | 6/2020 | He | G02F 1/136286 |
| 2020/0357874 A1* | 11/2020 | Gai | H10K 59/131 |
| 2021/0173269 A1 | 6/2021 | Li et al. | |
| 2021/0202659 A1* | 7/2021 | Lee | H10K 59/131 |
| 2021/0328002 A1* | 10/2021 | Lee | H10K 59/123 |

FOREIGN PATENT DOCUMENTS

| | | |
|---|---|---|
| WO | WO 2019/080640 A1 | 5/2019 |
| WO | WO 2020/083360 A1 | 4/2020 |

\* cited by examiner

DISPLAY DEVICE WITH REPAIR PATTERNS

CROSS REFERENCE TO RELATED APPLICATION

This application claims priority from Korean Patent Application No. 10-2020-0136949, filed on Oct. 21, 2020, which is hereby incorporated by reference for all purposes as if fully set forth herein.

BACKGROUND

Field

Embodiments of the present disclosure are related to a display device.

Description of Related Art

The growth of the information society leads to increased demand for display devices to display images and use of various types of display devices, such as liquid crystal display devices, organic light emitting display devices, etc.

The display devices, for example, can include a display panel that a plurality of gate lines, a plurality of data lines and a plurality of subpixels are disposed. Furthermore, the display devices can include a gate driving circuit driving the gate line, a data driving circuit driving the data line, and a controller controlling the gate driving circuit and the data driving circuit.

In the display panel, such as described above, various signal lines supplying a signal or a voltage for driving the subpixels such as the gate line and the data line can be disposed.

The signal lines disposed in the display panel can be disconnected in a manufacturing process, a defect of the display panel can occur due to a disconnection of the signal lines. Thus, methods are required to repair the disconnection of the signal lines disposed in the display panel effectively and to be capable of preventing an image abnormality due to the repair.

SUMMARY

Embodiments of the present disclosure provide a display device having a structure being capable of repairing a disconnection defect of a gate line disposed in a display panel easily.

Embodiments of the present disclosure provide a display device and a driving method thereof being capable of preventing an image abnormality of a display panel due to a disconnection defect and a repair of a gate line disposed in the display panel.

In an aspect, embodiments of the present disclosure provide a display device including a plurality of gate lines, a plurality of driving voltage lines crossing the plurality of gate lines, and a plurality of driving voltage line connection patterns crossing the plurality of driving voltage lines and disposed to be separated from each other between at least two driving voltage lines among the plurality of driving voltage lines.

The display device can include a plurality of repair patterns located between two adjacent driving voltage lines among the plurality of driving voltage lines.

Each of the plurality of repair patterns can include a first part overlapping a portion of one of the plurality of driving voltage line connection patterns and a second part overlapping a portion of another of the plurality of driving voltage line connection patterns.

The first part or the second part of each of the plurality of repair patterns can be electrically connected to the overlapping driving voltage line connection pattern.

Furthermore, the first part included in at least one repair pattern among the plurality of repair patterns can be electrically connected to the overlapping driving voltage line connection pattern and the second part can be electrically connected to the overlapping driving voltage line connection pattern.

At least one of the plurality of driving voltage line connection patterns can be electrically separated from the driving voltage line. And at least one of the plurality of driving voltage line connection patterns can be electrically connected to one of the plurality of gate lines.

At least one of the plurality of gate lines can be separated between two adjacent driving voltage lines among the plurality of driving voltage lines. And a scan signal supplied to at least one of the plurality of gate lines can go through at least one driving voltage line connection pattern of the plurality of driving voltage line connection patterns and at least one repair pattern of the plurality of repair patterns.

In another aspect, embodiments of the present disclosure provide a display device including a plurality of gate lines, a plurality of driving voltage lines disposed on a different layer from a layer where the plurality of gate lines are disposed, and a plurality of driving voltage line connection patterns disposed on a same layer as a layer where the plurality of gate lines are disposed and crossing at least one of the plurality of driving voltage lines.

At least one of the plurality of gate lines can be separated between two adjacent driving voltage lines among the plurality of driving voltage lines, and can be electrically connected by at least one of the plurality of driving voltage line connection pattern.

At least one of the plurality of gate lines can be electrically connected to the driving voltage line connection pattern by a portion cut from at least one of the plurality of driving voltage lines.

According to various embodiments of the present disclosure, as repairing a disconnected gate line by using a driving voltage line and a driving voltage line connection pattern, a disconnection defect of the gate line can be repaired easily without arranging a separate line for repairing the gate line.

According to various embodiments of the present disclosure, as making a pixel where a disconnection point of the gate line is located to be darkened and to be electrically connected to the adjacent pixel to be driven, an image abnormality can be prevented due to the disconnection of the gate line and the repair.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
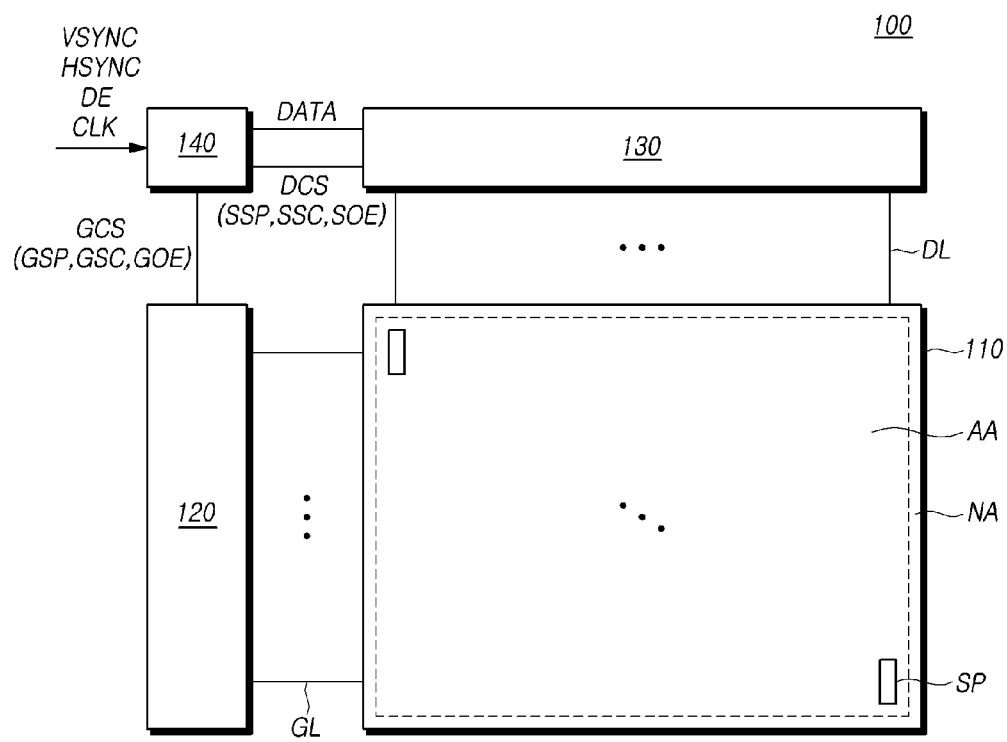
FIG. 1 is a diagram schematically illustrating a configuration of a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a diagram schematically illustrating a configuration included in a display device 100 according to embodiments of the present disclosure. All the components of the display device 100 according to all embodiments of the present disclosure are operatively coupled and configured.

Referring to FIG. 1, the display device 100 can include a display panel 110 including an active area AA where a plurality of subpixels SP are disposed, and a non-active area NA where a signal line or a driving circuit is disposed and located outside the active area AA. The display device 100 can include a gate driving circuit 120, a data driving circuit 130 and a controller 140 for driving the display panel 110.

A plurality of gate lines GL and a plurality of data lines DL can be arranged on the display panel 110. Furthermore, a voltage line supplied with various signals or voltages other than the gate line GL and the data line DL can be disposed on the display panel 110.

The subpixel SP can be located in areas where the gate line GL and the data line DL intersect each other. The subpixel SP can include a plurality of circuit elements, and two or more subpixels SP can constitute one pixel.

The gate driving circuit 120 is controlled by the controller 140. The gate driving circuit 120 can sequentially output scan signals to the plurality of gate lines GL arranged on the display panel 110, thereby controlling the driving timing of the plurality of subpixels SP.

The gate driving circuit 120 can include one or more gate driver integrated circuits GDIC.

The gate driving circuit 120 can be located only at one side of the display panel 110, or can be located at both sides thereof according to a driving method. The gate driving circuit 120 can be implemented as a gate in panel GIP type disposed on a bezel area of the display panel 110.

The data driving circuit 130 can receive image data from the controller 140 and converts the image data into an analog data voltage Vdata. The data driving circuit 130 outputs the data voltage Vdata to each data line DL according to the timing at which the scan signal is applied through the gate line GL so that each of the plurality of subpixels SP emits light having brightness according to the image data.

The data driving circuit 130 can include one or more source driver integrated circuits SDIC.

The data driving circuit 130 can be located at only one side of the display panel 110, or can be located at both sides thereof according to a driving method.

The controller 140 supplies various control signals to the gate driving circuit 120 and the data driving circuit 130, and controls the operation of the gate driving circuit 120 and the data driving circuit 130.

The controller 140 can allow the gate driving circuit 120 to output a scan signal according to the timing implemented in each frame. The controller 140 can convert a data signal received from the outside to conform to the data signal format used in the data driving circuit 130 and then output the converted image data to the data driving circuit 130.

The controller 140 receives, from the outside (e.g., a host system), various timing signals including a vertical synchronization signal VSYNC, a horizontal synchronization signal HSYNC, an input data enable DE signal, a clock signal CLK, and the like, as well as the image data.

The controller 140 can generate various control signals using various timing signals received from the outside, and can output the control signals to the gate driving circuit 120 and the data driving circuit 130.

For example, in order to control the gate driving circuit 120, the controller 140 can output various gate control signals GCS including a gate start pulse GSP, a gate shift clock GSC, a gate output enable signal GOE, or the like.

The gate start pulse GSP controls operation start timing of one or more gate driver integrated circuits GDIC constituting the gate driving circuit 120. The gate shift clock GSC, which is a clock signal commonly input to one or more gate driver integrated circuits GDIC, controls the shift timing of a scan signal. The gate output enable signal GOE specifies timing information on one or more gate driver integrated circuits GDIC.

In addition, in order to control the data driving circuit 130, the controller 140 can output various data control signals DCS including a source start pulse SSP, a source sampling clock SSC, a source output enable signal SOE, or the like.

The source start pulse SSP controls a data sampling start timing of one or more source driver integrated circuits SDIC constituting the data driving circuit 130. The source sampling clock SSC is a clock signal for controlling the timing of sampling data in the respective source driver integrated circuits SDIC. The source output enable signal SOE controls the output timing of the data driving circuit 130.

The display device 100 can further include a power management integrated circuit for supplying various voltages or currents to the display panel 110, the gate driving circuit 120, the data driving circuit 130, and the like or controlling various voltages or currents to be supplied thereto.

Various circuit elements for driving of the subpixel SP can be disposed on each subpixel SP.

Figure 2:
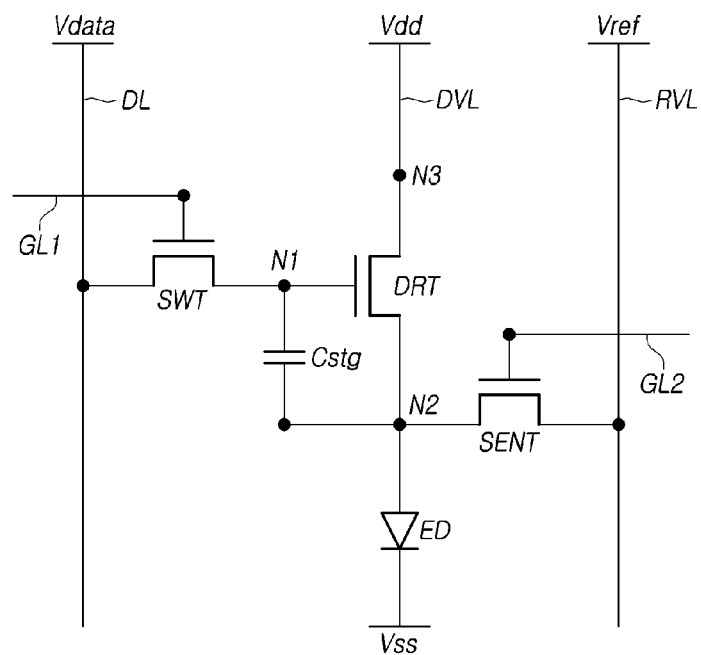
FIG. 2 is a diagram illustrating an example of a circuit structure of a subpixel included in a display device according to embodiments of the present disclosure.

FIG. 2 is a diagram illustrating an example of a circuit structure of the subpixel SP included in the display device 100 according to embodiments of the present disclosure.

Referring to FIG. 2, each subpixel SP can include a light-emitting element ED, and a driving transistor DRT driving the light-emitting element ED. The light-emitting element ED, for example, can be an organic light-emitting diode OLED, but not limited to this.

The subpixel SP can include at least one transistor other than the driving transistor DRT. The subpixel SP, for example, can include a switching transistor SWT electrically connected between a first node N1 and the data line DL. The subpixel SP can include a sensing transistor SENT electrically connected between a second node N2 and a reference voltage line RVL.

The example illustrated in FIG. 2 illustrates the case that the driving transistor DRT, the switching transistor SWT and the sensing transistor SENT are N types, but in some cases, at least one transistor can be P type.

The subpixel SP can include a capacitor Cstg electrically connected between the first node N1 and the second node N2.

The light-emitting element ED can include a first electrode (e.g., an anode electrode or a cathode electrode), a light-emitting layer and a second electrode (e.g., a cathode electrode or an anode electrode).

The first electrode of the light-emitting element ED can be electrically connected to the second node N2. A base voltage Vss can be applied to the second electrode of the light-emitting element ED. The base voltage Vss can be a low potential driving voltage.

The driving transistor DRT can drive the light-emitting element ED by supplying a driving current to the light-emitting element ED.

A gate node of the driving transistor can be electrically connected to the first node N1. A source node or a drain node of the driving transistor DRT can be electrically connected to the second node N2. The drain node or the source node of the driving transistor DRT can be electrically connected to a third node N3.

The third node N3 can be electrically connected to a driving voltage line DVL supplying a driving voltage Vdd. The driving voltage Vdd can be a high potential driving voltage.

The driving transistor DRT can be controlled by a voltage of the first node N1. The driving transistor DRT can be turned-on or turned-off by a voltage applied to the first node N1 and can control the driving current supplied to the light-emitting element ED.

The switching transistor SWT can be controlled by the scan signal supplied through a first gate line GL1 and can control a supply of the data voltage Vdata to the first node N1.

The sensing transistor SENT can be controlled by the scan signal supplied through a second gate line GL2 and can control a supply of a reference voltage Vref to the second node N2.

In some cases, the switching transistor SWT and the sensing transistor SENT can be controlled by a same gate line GL.

According to driving of the switching transistor SWT and the sensing transistor SENT, a voltage applied to the first node N1 and the second node N2 can be controlled, and the driving current supplied through the driving transistor DRT can be controlled.

And the capacitor Cstg can be electrically connected between the first node N1 and the second node N2, and can maintain the data voltage Vdata corresponding to the image data during one frame.

This capacitor Cstg may not be a parasitic capacitor which is an internal capacitor being present between the first node N1 and the second node N2, but can be an external capacitor designed intentionally between the first node N1 and the second node N2.

A circuit structure of the subpixel SP illustrated in FIG. 2 is an example for a description, and the subpixel SP can be constituted as two transistors except for the sensing transistor SENT, and one capacitor. Alternatively, in some cases, the subpixel SP can further include one or more transistors or one or more capacitors.

Two or more subpixels SP disposed in the display panel 110 can form one pixel. Depending on the subpixel SP forming one pixel, an arrangement structure of various signal lines and voltage lines disposed in the display panel 110 can be various.

Figure 3:
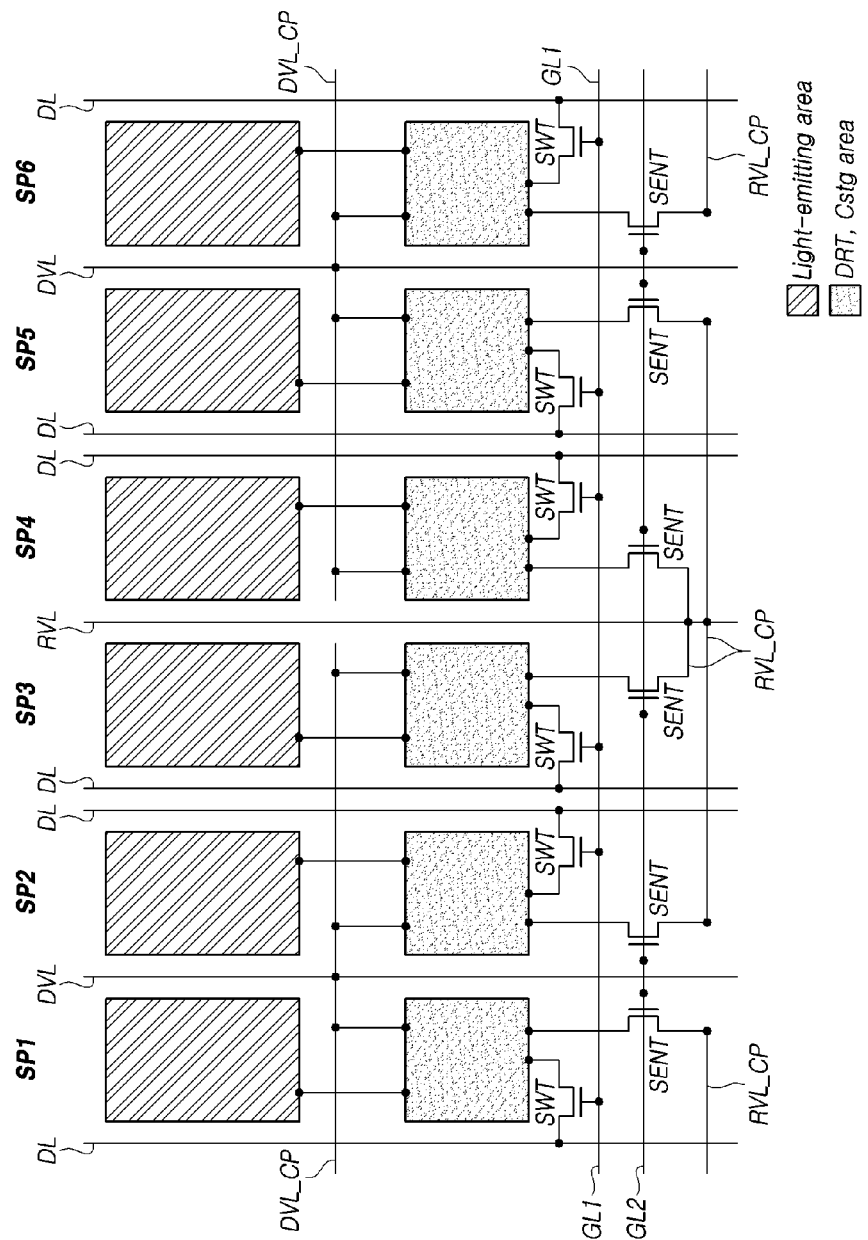
FIG. 3 is a diagram illustrating an example of a connection structure of a subpixel and a signal line included in a display device according to embodiments of the present disclosure.

FIG. 3 is a diagram illustrating an example of a connection structure of the subpixel SP and the signal line included in the display device 100 according to embodiments of the present disclosure.

Referring to FIG. 3, an example of a circuit structure of six subpixels SP1, SP2, SP3, SP4, SP5, SP6 which are located adjacently is illustrated, and an example of four subpixels SP2, SP3, SP4, SP5 forming one pixel is illustrated.

Each subpixel SP can include a circuit area where a transistor including the driving transistor DRT and the capacitor Cstg are disposed. Each subpixel SP can include a light-emitting area where the light-emitting element ED is disposed. The light-emitting area can be at least a part area of an area other than the circuit area in the subpixel SP.

The first gate line GL1 and the second gate line GL2 can be disposed for controlling a driving of the subpixels SP which are disposed on a same row.

The data line DL supplying the data voltage Vdata to the subpixel SP, for example, can be disposed for each subpixel SP. And two data lines DL can be located adjacently.

For example, the data line DL supplying the data voltage Vdata to a second subpixel SP2 and the data line DL supplying the data voltage Vdata to a third subpixel SP3 can be located between the second subpixel SP2 and the third subpixel SP3.

The driving voltage line DVL and the reference voltage line RVL can be located on an area where the data line DL is not disposed between the subpixels SP. Thus, the driving voltage line DVL and the reference voltage line RVL can be disposed on a same layer as the data line DL, and an increase of a thickness can be minimized due to disposition of various voltage lines.

Each of the driving voltage line DVL and the reference voltage line RVL can supply a voltage to two or more subpixels SP which are disposed adjacently in a direction crossing the voltage line.

For example, the reference voltage line RVL disposed between the third subpixel SP3 and a fourth subpixel SP4 can be electrically connected to the sensing transistors SENT disposed on the second subpixel SP2, the third subpixel SP3, the fourth subpixel SP4 and a fifth subpixel SP5 by a reference voltage line connection pattern RVL_CP.

The reference voltage line connection pattern RVL_CP can be disposed on a different layer from a layer where the reference voltage line RVL is disposed.

The reference voltage line RVL can supply the reference voltage Vref to four subpixels SP2, SP3, SP4, SP5 through the reference voltage line connection pattern RVL_CP.

The driving voltage line DVL, similarly to the reference voltage line RVL, can supply the driving voltage Vdd to four subpixels SP which are located at both sides of the driving voltage line DVL.

For example, the driving voltage line DVL located between a first subpixel SP1 and the second subpixel SP2 can be electrically connected to the first subpixel SP1, the second subpixel SP2, and the third subpixel SP3 through a driving voltage line connection pattern DVL_CP. Furthermore, the driving voltage line DVL can be electrically connected to the subpixel SP located at one side of the first subpixel SP1.

The driving voltage line DVL located between the fifth subpixel SP5 and a sixth subpixel SP6 can supply the driving voltage Vdd to four subpixels SP located at both sides of the driving voltage line DVL.

The driving voltage line connection pattern DVL_CP can be disposed on a different layer from a layer where the driving voltage line DVL is disposed.

As described above, the driving voltage line DVL or the reference voltage line RVL can supply the driving voltage Vdd or the reference voltage Vref required for the driving of the subpixel SP to the plurality of subpixels SP through the driving voltage line connection pattern DVL_CP or the reference voltage line connection pattern RVL_CP.

Furthermore, the driving voltage line connection pattern DVL_CP or the reference voltage line connection pattern RVL_CP can be used for repairing the gate line GL in a case where the gate line GL disposed on the subpixel SP is disconnected.

Figure 4:
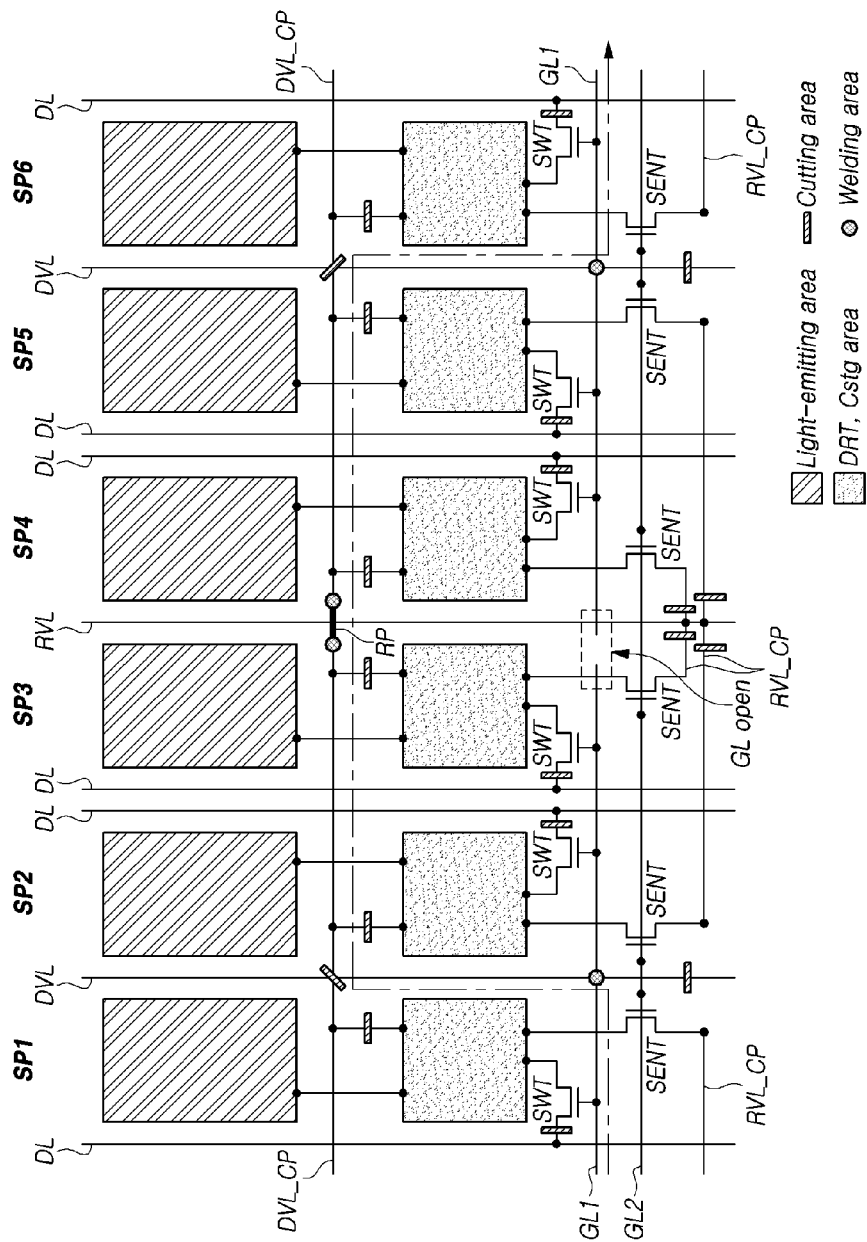
FIG. 4 is a diagram illustrating an example of a structure repairing a defect of a gate line in a connection structure of a subpixel and a signal line included in a display device according to embodiments of the present disclosure.

FIG. 4 is a diagram illustrating an example of a structure repairing a defect of the gate line GL in a connection structure of the subpixel SP and the signal line included in the display device 100 according to embodiments of the present disclosure.

Referring to FIG. 4, an example where the first gate line GL1 is disconnected among the gate lines GL disposed on the subpixel SP (GL open) is illustrated.

In the case where a point that the first gate line GL1 is disconnected is located on the third subpixel SP3, the second subpixel SP2, the fourth subpixel SP4 and the fifth subpixel SP5 constituting one pixel with the third subpixel SP3 can be darkened. Furthermore, in some cases, the first subpixel SP1 and the sixth subpixel SP6 located at both sides of the pixel darkened can be darkened.

The subpixel SP can be darkened by cutting a portion connecting between the transistor and the signal line disposed on the subpixel SP.

For example, a portion between the switching transistor SWT and the data line DL can be cut. A portion between the sensing transistor SENT and the reference voltage line RVL can be cut. A portion between the driving transistor DRT and the driving voltage line DVL can be cut.

The subpixel SP can be darkened, and a repair of the gate line GL can be performed by using the driving voltage line connection pattern DVL_CP disposed on the subpixel SP darkened.

For example, the driving voltage line DVL overlapping the first gate line GL1 disconnected can be cut at two points. And a portion which is cut from the driving voltage line DVL can be welded with the first gate line GL1.

A portion of the driving voltage line connection pattern DVL_CP disposed on the second subpixel SP2 and the third subpixel SP3 can be cut from the driving voltage line DVL. Furthermore, a portion of the driving voltage line connection pattern DVL_CP disposed on the fourth subpixel SP4 and the fifth subpixel SP5 can be cut from the driving voltage line DVL.

A cut portion of the driving voltage line connection pattern DVL_CP can be a state that is electrically connected to a cut portion of the driving voltage line DVL.

The cut portion of the driving voltage line connection pattern DVL_CP can be welded with a repair pattern RP located on the subpixel SP which is darkened.

The driving voltage line connection pattern DVL_CP disposed on the subpixel SP where the point that the first gate line GL1 is disconnected is located can be electrically connected by the repair pattern RP.

The first gate line GL1 disconnected can be electrically connected with the cut portion from the driving voltage line DVL, the cut portion from the driving voltage line connection pattern DVL_CP and the repair pattern RP. A disconnection defect of the first gate line GL1 can be repaired by a portion of the voltage line disposed on the subpixel SP.

Thus, the scan signal supplied through the first gate line GL1 can be supplied by going through the cut portion from the driving voltage line DVL, the cut portion from the driving voltage line connection pattern DVL_CP and the repair pattern RP disposed on the subpixel SP which is darkened.

Furthermore, in a case where a disconnection of the second gate line GL2 occurs, the second gate line GL2 can be repaired by a similar method.

As described above, in a case that the gate line GL is disconnected, as the disconnection of the gate line GL is repaired by using a portion of the voltage line disposed on the subpixel SP, the disconnection defect of the gate line GL can be repaired easily while preventing a reduction of an aperture ratio of the subpixel SP by minimizing a disposition of a separated component for repairing.

The repair pattern RP can be disposed on a different layer from a layer where the driving voltage line connection pattern DVL_CP is disposed.

The repair pattern RP can be disposed on a different layer from a layer where the reference voltage line RVL is disposed. Alternatively, the repair pattern RP can be disposed on a same layer as a layer where the reference voltage line RVL is disposed.

Figure 5:
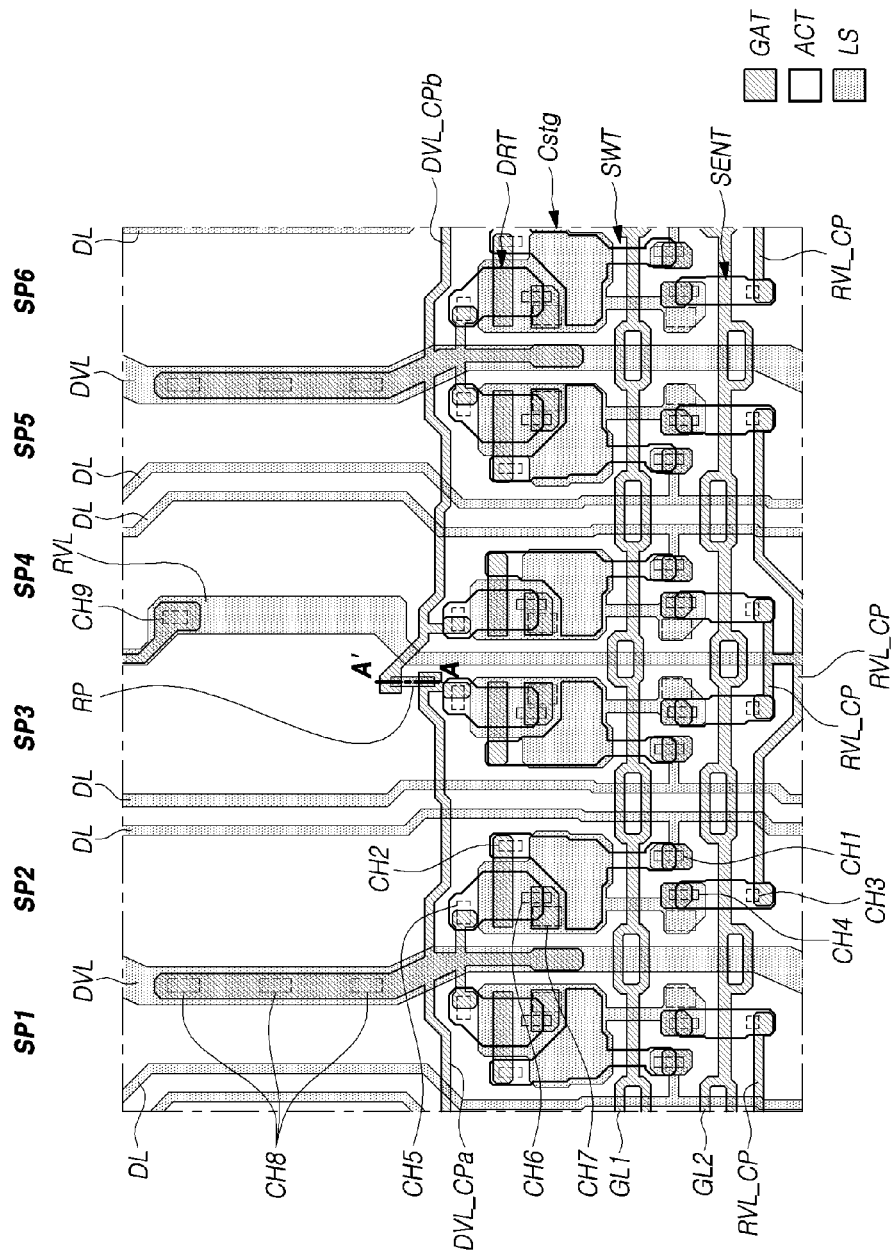
FIG. 5 is a diagram illustrating an example of a structure in which a repair pattern for repairing a gate line is disposed on a subpixel included in a display device according to embodiments of the present disclosure.

FIG. 5 is a diagram illustrating an example of a structure in which the repair pattern RP for repairing the gate line GL is disposed on the subpixel SP included in the display device 100 according to embodiments of the present disclosure.

Referring to FIG. 5, the data line DL, the driving voltage line DVL and the reference voltage line RVL can be implemented by using a light-shielding metal LS. The gate line GL, the driving voltage line connection pattern DVL_CP and the reference voltage line connection pattern RVL_CP can be implemented by using a gate metal GAT.

FIG. 5 illustrates an example that the gate metal GAT is located over the light-shielding metal LS. That is, it illustrates the example that the gate line GL is located over the data line DL, but embodiments of the present disclosure, in some cases, can be applied to a structure in which the data line DL is located over the gate line GL.

An active layer ACT can be disposed between a layer where the light-shielding metal LS is disposed and a layer where the gate metal GAT is disposed.

The active layer ACT can be made as a channel of the switching transistor SWT, the sensing transistor SENT and the driving transistor DRT. Furthermore, the active layer ACT can be made as a gate electrode of the driving transistor DRT and can be made as the capacitor Cstg.

The switching transistor SWT can be electrically connected to the data line DL through a first contact-hole CH1. The switching transistor SWT can be electrically connected to the gate electrode of the driving transistor DRT through the second contact-hole CH2.

The sensing transistor SENT can be electrically connected to the reference voltage line connection pattern RVL_CP through a third contact-hole CH3. The sensing transistor SENT can be electrically connected to a source electrode of the driving transistor DRT through a fourth contact-hole CH4.

The driving transistor DRT can be electrically connected to the driving voltage line connection pattern DVL_CP through a fifth contact-hole CH5. The driving transistor DRT can be electrically connected to an anode electrode (not illustrated) of the light-emitting element ED, which is a pixel electrode, through a sixth contact-hole CH6 and a seventh contact-hole CH7.

The driving voltage line connection pattern DVL_CP can be electrically connected to the driving voltage line DVL through an eighth contact-hole CH8.

The reference voltage line connection pattern RVL_CP can be electrically connected to the reference voltage line RVL through a ninth contact-hole CH9.

The driving voltage line connection pattern DVL_CP connected to the driving voltage line DVL disposed between the first subpixel SP1 and the second subpixel SP2 can be disposed across four subpixels SP located at both sides of the driving voltage line DVL.

The driving voltage line connection pattern DVL_CP connected to the driving voltage line DVL disposed between the fifth subpixel SP5 and the sixth subpixel SP6 can be disposed across four subpixels SP located at both sides of the driving voltage line DVL.

The driving voltage line connection patterns DVL_CPa, DVL_CPb may not be connected to each other on a boundary area between the third subpixel SP3 and the fourth subpixel SP4.

The driving voltage line connection patterns DVL_CPa, DVL_CPb connected to different driving voltage lines DVL can be a separate structure on the subpixel SP.

The repair pattern RP including a portion overlapping the driving voltage line connection patterns DVL_CPa, DVL_CPb can be disposed between the separate driving voltage line connection patterns DVL_CPa, DVL_CPb.

Here, the repair pattern RP can be disposed as a metal other than the light-shielding metal LS or the gate metal GAT. Alternatively, the repair pattern RP can be implemented with the light-shielding metal LS used for disposing the reference voltage line RVL.

Thus, the repair pattern RP can be located on a side of the reference voltage line RVL. And the one driving voltage line connection pattern DVL_CPb among the driving voltage line connection patterns DVL_CPa, DVL_CPb overlapping the repair pattern RP can cross the reference voltage line RVL. A portion of the driving voltage line connection pattern DVL_CP can overlap the reference voltage line RVL.

That is, one of the driving voltage line connection patterns DVL_CPa, DVL_CPb which are located between two driving voltage lines DVL and are separated from each other can be disposed to be across the reference voltage line RVL for repairing.

Here, the driving voltage line connection patterns DVL_CPa, DVL_CPb which are separated from each other, in some cases, can be located on a straight line.

As the repair pattern RP is separated from the driving voltage line connection patterns DVL_CPa, DVL_CPb between the separate driving voltage line connection patterns DVL_CPa, DVL_CPb, when the disconnection defect of the gate line GL occurs, a repair using the driving voltage line connection patterns DVL_CPa, DVL_CPb and the repair pattern RP can be performed.

Figure 6:
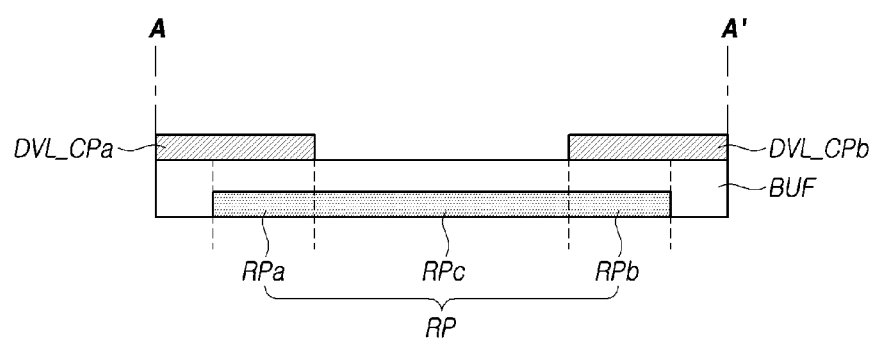
FIG. 6 is a diagram illustrating an example of a cross-sectional structure, taken along line A-A' in FIG. 5.

FIG. 6 is a diagram illustrating an example of a cross-sectional structure, taken along line A-A' in FIG. 5.

Referring to FIG. 6, the repair pattern RP can be implemented with the light-shielding metal LS. In the case where the repair pattern RP is implemented with the light-shielding metal LS, the repair pattern RP can be disposed on a same layer as a layer where the data line DL, the driving voltage line DVL, and the reference voltage line RVL are disposed.

A buffer layer BUF can be disposed on the repair pattern RP.

The driving voltage line connection patterns DVL_CPa, DVL_CPb can be disposed on the buffer layer BUF. In some cases, the active layer ACT or one or more insulating layer can be disposed on the buffer layer BUF.

The driving voltage line connection patterns DVL_CPa, DVL_CPb can be implemented with the gate metal GAT. In the case that the driving voltage line connection patterns DVL_CPa, DVL_CPb are implemented with the gate metal GAT, the driving voltage line connection patterns DVL_CPa, DVL_CPb can be disposed on a same layer as a layer where the gate line GL and the reference voltage line connection pattern RVL_CP are disposed.

The repair pattern RP can include a first part RP1 overlapped with one driving voltage line connection pattern DVL_CPa, a second part RP2 overlapped with another driving voltage line connection pattern DVL_CPb and a third part RP3 between the first part RP1 and the second part RP2.

The repair pattern RP can be insulated from the driving voltage line connection patterns DVL_CPa, DVL_CPb.

In some cases, the repair pattern RP can be electrically connected to any one of the overlapping driving voltage line connection patterns DVL_CPa, DVL_CPb.

In this case, the buffer layer BUF can include a contact-hole which is located on an area where the repair pattern RP and the driving voltage line connection patterns DVL_CPa, DVL_CPb overlap.

For example, where the repair pattern RP is electrically connected to one driving voltage line connection pattern DVL_CPa among the overlapping driving voltage line connection patterns DVL_CPa, DVL_CPb, as the repair pattern RP is welded with another driving voltage line connection pattern DVL_CPb, a repair for the gate line GL can be performed.

Thus, the display device 100 can include the repair pattern RP located on a point where the driving voltage line connection pattern DVL_CP is separated.

A portion of the repair pattern RP can overlap the driving voltage line connection pattern DVL_CP. The repair pattern RP can be insulated from the overlapping driving voltage line connection pattern DVL_CP, or can be electrically connected to one driving voltage line connection pattern DVL_CP.

Where a repair is performed due to the disconnection defect of the gate line GL, the repair pattern RP can be electrically connected to two overlapping driving voltage line connection patterns DVL_CP.

Figure 7:
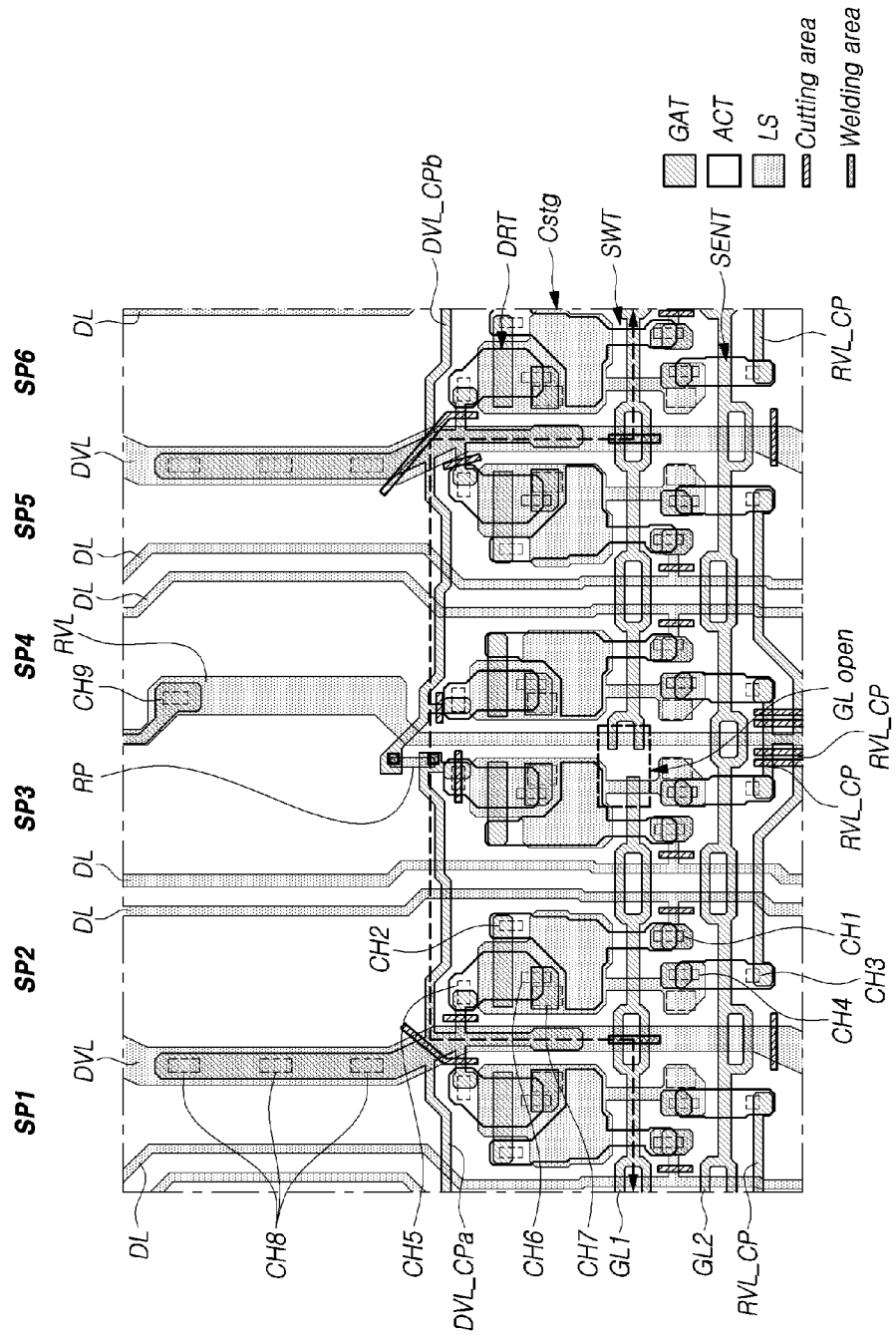
FIG. 7 is a diagram illustrating an example of a structure repairing a defect of a gate line in the example of the structure illustrated in FIG. 5.

FIG. 7 is a diagram illustrating an example of a structure repairing a defect of the gate line GL in the example of the structure illustrated in FIG. 5.

Referring to FIG. 7, an example where the first gate line GL1 is disconnected on the third subpixel SP3 is illustrated.

Where the first gate line GL1 is disconnected, the third subpixel SP3 at a point where the first gate line GL1 is disconnected can be darkened. Furthermore, the second subpixel SP2, the fourth subpixel SP4 and the fifth subpixel SP5 constituting one pixel with the third subpixel SP3 can be darkened. Furthermore, in some cases, the first subpixel SP1 and the sixth subpixel SP6 which share the driving voltage line connection pattern DVL_CP with the darkened pixel can be darkened.

For darkening the subpixel SP, a portion that the transistor and the voltage line are connected can be cut.

For the repair of the first gate line GL1, a portion of the driving voltage line DVL can be cut. The cut portion from the driving voltage line DVL can be welded with the overlapping first gate line GL1 to be electrically connected to the first gate line GL1.

The driving voltage line connection patterns DVL_CPa, DVL_CPb can be cut with the driving voltage line DVL. The cut driving voltage line connection patterns DVL_CPa, DVL_CPb can be welded with the overlapping repair pattern RP to be electrically connected to the repair pattern RP.

Thus, the disconnected first gate line GL1 can be electrically connected by a portion cut from the driving voltage line DVL, a portion cut from the driving voltage line connection patterns DVL_CPa, DVL_CPb and the repair pattern RP.

That is, the disconnection defect of the first gate line GL1 can be repaired by a structure bypassing the darkened pixel.

Figure 8:
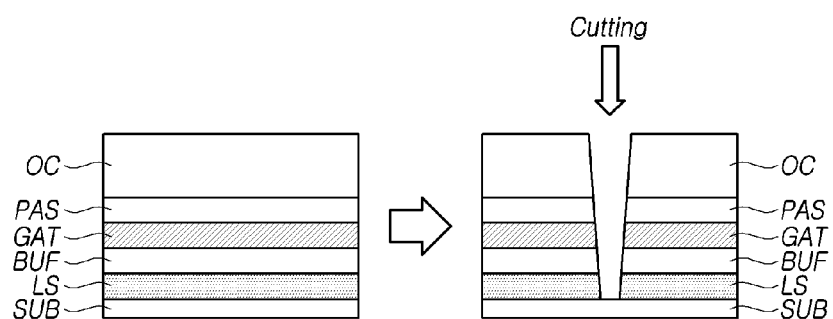
FIG. 8 is a diagram illustrating an example of a cross-sectional structure of a cut portion in the structure illustrated in FIG. 5.

FIG. 8 is a diagram illustrating an example of a cross-sectional structure of a cut portion in the structure illustrated in FIG. 5.

Referring to FIG. 8, a layer where the light-shielding metal LS is disposed is located on a substrate SUB, and the buffer layer BUF can be disposed on the light-shielding metal LS. A layer where the gate metal GAT is disposed is located on the buffer layer BUF, and a passivation layer PAS or an overcoat layer OC can be disposed on the gate metal GAT.

The light-shielding metal LS constituting the data line DL or the voltage line can be disconnected by cutting. Furthermore, the gate metal GAT constituting the gate line GL or a voltage line connection pattern can be disconnected by cutting.

As a portion of the voltage line is disconnected by cutting, the pixel where a disconnection point of the gate line GL is located can be darkened.

Figure 9:
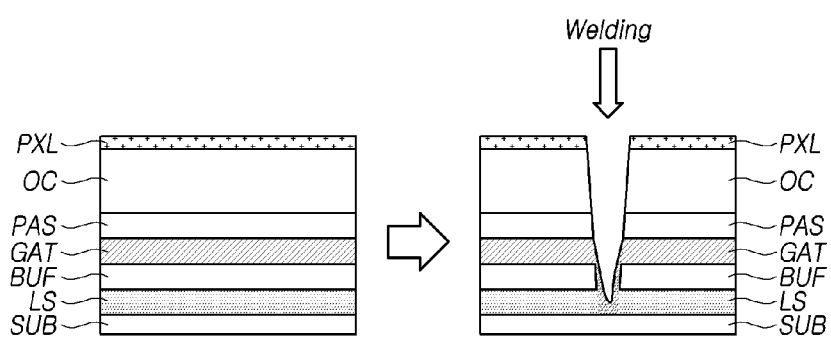
FIG. 9 is a diagram illustrating an example of a cross-sectional structure of a welded portion in the structure illustrated in FIG. 5.

FIG. 9 is a diagram illustrating an example of a cross-sectional structure of a welded portion in the structure illustrated in FIG. 5.

Referring to FIG. 9, the gate metal GAT located on the buffer layer BUF and the light-shielding metal LS located under the buffer layer BUF can be electrically connected by welding.

For example, on an area where the first gate line GL1 made of the gate metal GAT and the driving voltage line DVL made of the light-shielding metal LS overlap, the disconnected first gate line GL1 can be electrically connected to the portion cut from the driving voltage line DVL by welding.

The driving voltage line connection patterns DVL_CPa, DVL_CPb made of the gate metal GAT can be electrically connected to the repair pattern RP made of the light-shielding metal LS by welding.

As described above, according to embodiments of the present disclosure, on the subpixel SP where the disconnection point of the gate line GL is located, by welding the gate line GL and the driving voltage line DVL and welding the driving voltage line connection pattern DVL_CP and the repair pattern RP, the disconnection of the gate line GL can be repaired easily.

In the case where the repair of the gate line GL is performed by using the driving voltage line connection pattern DVL_CP, by making the pixel where the disconnection point of the gate line GL is located to be darkened, a driving abnormality of the pixel can be prevented due to the repair of the gate line GL.

Furthermore, embodiments of the present disclosure provide methods being capable of driving the darkened pixel by electrically connecting the darkened pixel to an adjacent pixel and driving.

Figure 10:
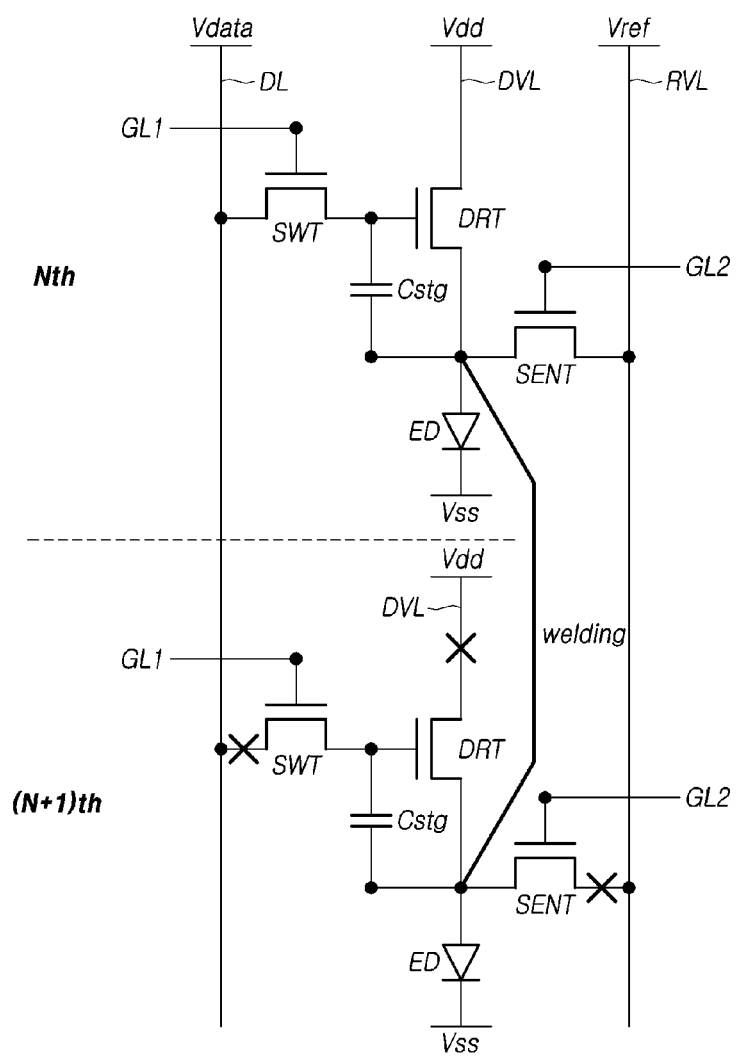
FIG. 10 is a diagram illustrating an example of a method driving a subpixel that a defect of a gate line is repaired in a display device according to embodiments of the present disclosure.

FIG. 10 is a diagram illustrating an example of a method driving the subpixel SP where a defect of the gate line GL is repaired in the display device 100 according to embodiments of the present disclosure.

Referring to FIG. 10, it illustrates an example that (N+1)th subpixel SP neighboring Nth subpixel SP is darkened.

As the (N+1)th subpixel SP is darkened, a point where the data line DL and the switching transistor SWT are connected can be cut. A point where the reference voltage line RVL and the sensing transistor SENT are connected in the (N+1)th subpixel SP can be cut. A point where the driving voltage line DVL and the driving transistor DRT are connected in the (N+1)th subpixel SP can be cut.

The first electrode of the light-emitting element ED disposed on the (N+1)th subpixel SP can be electrically connected to the first electrode of the light-emitting element ED disposed on the Nth subpixel SP by welding.

The (N+1)th subpixel SP can represent a luminance according to the data voltage Vdata supplied to the Nth subpixel SP in a state to be darkened.

In this case, a level of the data voltage Vdata supplied to the Nth subpixel SP can be higher than a level of the data voltage Vdata corresponding to the image data corresponding to the Nth subpixel SP.

For example, in a case where the level of the data voltage Vdata corresponding to the image data that the Nth subpixel SP represents is 10V, the data voltage Vdata of 11V can be supplied to the Nth subpixel SP.

Thus, as the Nth subpixel SP and the (N+1)th subpixel are driven according to the data voltage Vdata of 11V supplied to the Nth subpixel SP, the darkened (N+1)th subpixel SP can represent luminance, and a luminance drop of the Nth subpixel SP can be prevented.

Figure 11:
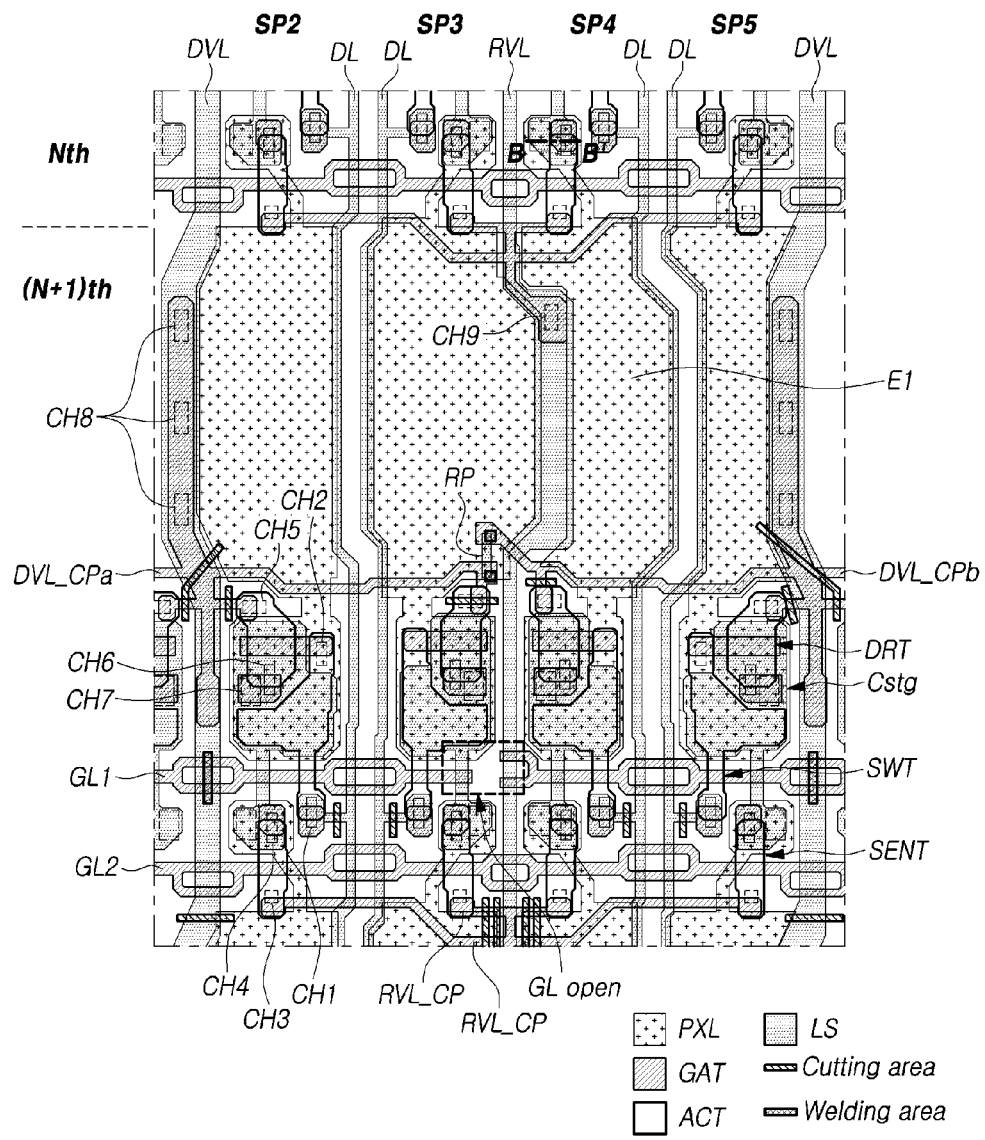
FIG. 11 is a diagram illustrating an example of a structure of a subpixel in which a repair of a light-emitting element is performed for driving a subpixel such that a defect of a gate line is repaired in a display device according to embodiments of the present disclosure.

FIG. 11 is a diagram illustrating an example of a structure of the subpixel SP where a repair of the light-emitting element ED is performed for driving the subpixel SP such that a defect of the gate line GL is repaired in the display device 100 according to embodiments of the present disclosure.

Referring to FIG. 11, an example that the first gate line GL1 is disconnected is illustrated. The (N+1)th subpixel SP where a point that the first gate line GL1 is disconnected is located can be darkened.

The first electrode E1 of the light-emitting element ED located on the (N+1)th subpixel SP can be electrically connected to the first electrode E1 of the light-emitting element ED located on the Nth subpixel SP.

For example, the first electrode E1 made of a pixel metal PXL located over the gate metal GAT can be disposed on the (N+1)th subpixel SP. The first electrode E1 can be an anode electrode of the light-emitting element ED.

The first electrode E1 can be electrically connected to the driving transistor DRT through the seventh contact-hole CH7.

A portion of the first electrode E1 disposed on the (N+1)th subpixel SP can overlap a portion of the sensing transistor SENT located on the Nth subpixel SP.

In a structure where the portion of the first electrode E1 disposed on the (N+1)th subpixel SP overlaps the portion of the sensing transistor SENT located on the Nth subpixel SP, when the (N+1)th subpixel SP becomes darkened, the portion of the first electrode E1 disposed on the (N+1)th subpixel SP can be welded and electrically connected to the portion of the sensing transistor SENT located on the Nth subpixel SP.

Thus, the first electrode E1 disposed on the (N+1)th subpixel SP can be electrically connected to the first electrode E1 disposed on the Nth subpixel SP.

Figure 12:
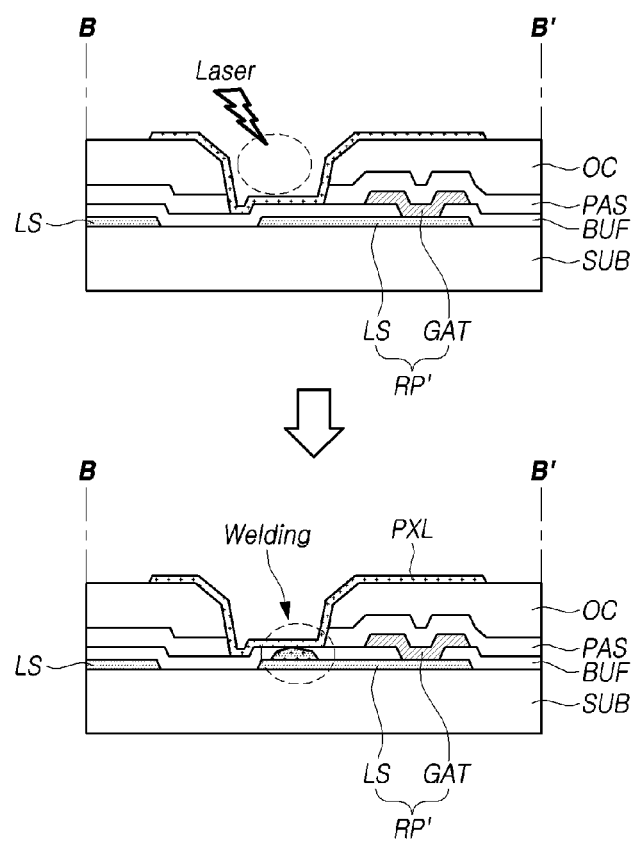
FIG. 12 is a diagram illustrating an example of a cross-sectional structure, taken along line B-B' in FIG. 11.

FIG. 12 is a diagram illustrating an example of a cross-sectional structure, taken along line B-B' in FIG. 11.

Referring to FIG. 12, a portion B-B' illustrated in FIG. 11 illustrates a portion that the portion of the first electrode E1 disposed on the (N+1)th subpixel SP overlaps the portion of the sensing transistor SENT disposed on the Nth subpixel SP.

Before performing the repair of the darkened pixel, the pixel metal PXL and the light-shielding metal LS located on the portion B-B' can be insulated from each other.

The pixel metal PXL can be a portion of the first electrode E1 disposed on the (N+1)th subpixel SP.

The light-shielding metal LS and the gate metal GAT can be a portion of the sensing transistor SENT, or can be a pixel repair pattern RP' electrically connected to the sensing transistor SENT.

The pixel metal PXL located on the overcoat layer OC can be electrically connected to the light-shielding metal LS by welding.

Thus, the first electrode E1 of the light-emitting element ED disposed on the darkened (N+1)th subpixel SP can be electrically connected to the first electrode E1 of the light-emitting element ED disposed on the Nth subpixel SP. And by controlling the level of the data voltage Vdata supplied to the Nth subpixel SP, the darkened pixel can be driven and a luminance drop of the pixel connected to the darkened pixel can be prevented.

According to embodiments of the present disclosure above-mentioned, by disposing the repair pattern RP to overlap the driving voltage line connection pattern DVL_CP, when the disconnection of the gate line GL occurs, a path through which the gate line GL supplies the scan signals can be provided by using the driving voltage line connection pattern DVL_CP and the repair pattern RP.

Thus, the disconnection of the gate line GL disposed on the subpixel SP can be repaired easily while minimizing components disposed additionally on the subpixel SP.

Furthermore, according to embodiments of the present disclosure, the pixel where a point that the gate line GL is disconnected is located can be darkened, and the darkened pixel can be driven by connecting to adjacent pixel.

By this, the gate line GL can be repaired while preventing an image abnormality by the disconnection and the repair of the gate line GL.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device, comprising:
    a plurality of gate lines;
    a plurality of data lines crossing the plurality of gate lines;
    a plurality of driving voltage lines crossing the plurality of gate lines;
    a plurality of driving voltage line connection patterns crossing the plurality of driving voltage lines, and disposed to be separated from each other between at least two driving voltage lines among the plurality of driving voltage lines, the driving voltage line connection patterns including a first driving voltage line connection pattern and a second driving voltage line connection pattern adjacent to the first driving voltage line connection pattern in a direction of the gate lines, the first driving voltage line connection pattern extending along a first plurality of subpixels and crossing a first plurality of data lines among the data lines, and the second driving voltage line connection pattern extending along a second plurality of subpixels and crossing a second plurality of data lines among the data lines but not extending along the first plurality of subpixels and not crossing the first plurality of data lines; and
    a plurality of repair patterns located between two adjacent driving voltage lines among the plurality of driving voltage lines, and comprising a first part overlapping a portion of one of the plurality of driving voltage line connection patterns and a second part overlapping a portion of another of the plurality of driving voltage line connection patterns,
    wherein at least one of the plurality of driving voltage lines is cut at two or more points, and is electrically connected to at least one gate line located between the two or more points among the plurality of gate lines,
    wherein an anode electrode of at least one of a plurality of light-emitting elements located adjacent to a cut point of the driving voltage line, which is cut at the two or more points, is electrically connected to an anode electrode of another light-emitting element located adjacently, and
    wherein the repair patterns do not cross any of the data lines.

2. The display device of claim 1, wherein the first part included in at least one repair pattern among the plurality of repair patterns is electrically connected to a driving voltage line connection pattern of the plurality of driving voltage line connection patterns which the first part overlaps, and the second part included in the at least one repair pattern is electrically connected to another driving voltage line connection pattern of the plurality of driving voltage line connection patterns which the second part overlaps.

3. The display device of claim 1, wherein the first part or the second part of each of the plurality of repair patterns is electrically connected to a driving voltage line connection pattern of the plurality of driving voltage line connection patterns which the first part or the second part overlaps.

4. The display device of claim 1, wherein the plurality of repair patterns are disposed on a same layer as a layer where the plurality of driving voltage lines are disposed.

5. The display device of claim 1, wherein at least one of the plurality of driving voltage line connection patterns is electrically separated from one of the plurality of driving voltage lines.

6. The display device of claim 1, wherein at least one of the plurality of driving voltage line connection patterns is electrically connected to one of the plurality of gate lines.

7. The display device of claim 1, wherein the plurality of driving voltage line connection patterns are disposed on a same layer as a layer where the plurality of gate lines are disposed.

8. The display device of claim 1, wherein at least one driving voltage line located adjacent to the driving voltage line which is cut at the two or more points is cut at two or more points.

9. The display device of claim 1, wherein at least one of a source node and a drain node of at least one of a plurality of thin film transistors located adjacent to a cut point of the driving voltage line, which is cut at the two or more points, is cut.

10. The display device of claim 1, wherein at least one of the plurality of gate lines is separated between two adjacent driving voltage lines among the plurality of driving voltage lines.

11. The display device of claim 1, wherein a scan signal supplied to at least one of the plurality of gate lines goes through at least one driving voltage line connection pattern of the plurality of driving voltage line connection patterns and the at least one repair pattern of the plurality of repair patterns.

12. The display device of claim 1, further comprising:
    a plurality of reference voltage lines each located between two adjacent driving voltage lines among the plurality of driving voltage lines, and
    wherein a portion of each of the plurality of driving voltage line connection patterns overlaps one of the plurality of reference voltage lines.

13. The display device of claim 12, wherein one of the plurality of repair patterns are located at one side of one of the plurality of reference voltage lines.

14. A display device, comprising:
    a plurality of gate lines;
    a plurality of data lines crossing the plurality of gate lines;
    a plurality of driving voltage lines disposed on a different layer from a layer where the plurality of gate lines are disposed; and
    a plurality of driving voltage line connection patterns disposed on a same layer as a layer where the plurality of gate lines are disposed, and crossing at least one of the plurality of driving voltage lines, the driving voltage line connection patterns including a first driving voltage line connection pattern, a second driving voltage line connection pattern adjacent to the first driving voltage line connection pattern in a direction of the gate lines, and a plurality of repair patterns located between the first driving voltage line connection pattern and the second driving voltage line connection pattern, the first driving voltage line connection pattern extending along a first plurality of subpixels and crossing a first plurality of data lines among the data lines, and the second driving voltage line connection pattern extending along a second plurality of subpixels and crossing a second plurality of data lines among the data lines but not extending along the first plurality of subpixels and not crossing the first plurality of data lines,
    wherein at least one of the plurality of gate lines is disconnected between two adjacent driving voltage lines among the plurality of driving voltage lines, and is electrically connected by at least one of the plurality of driving voltage line connection patterns, and wherein the repair patterns do not cross any of the data lines.

15. The display device of claim 14, wherein the at least one of the plurality of gate lines is electrically connected to one of the plurality of driving voltage line connection patterns by a portion cut from at least one of the plurality of driving voltage lines.

16. The display device of claim 14, wherein the at least one of the plurality of gate lines is electrically connected by two or more of the plurality of driving voltage line connection patterns, and the repair pattern disposed on a same layer as a layer where the plurality of driving voltage lines are disposed.

17. The display device of claim 14, wherein a portion of each of the plurality of driving voltage line connection patterns overlaps at least one of a plurality of reference voltage lines disposed on a same layer as a layer where the plurality of driving voltage lines are disposed.

\* \* \* \* \*